US012754543B2

(12) United States Patent
Joensuu et al.

(10) Patent No.: US 12,754,543 B2
(45) Date of Patent: Oct. 6, 2026

(54) METHOD FOR ESTIMATING DISTURBANCES AND GIVING RECOMMENDATIONS FOR IMPROVING PROCESS PERFORMANCE

(71) Applicant: KEMIRA OYJ, Helsinki (FI)

(72) Inventors: Iiris Joensuu, Espoo (FI); Marjatta Piironen, Espoo (FI); Torsten Haverinen-Nielsen, Espoo (FI); Vesa-Matti Tikkala, Espoo (FI)

(73) Assignee: KEMIRA OYJ, Helsinki (FI)

( * ) Notice: Subject to any disclaimer, the term of this patent is extended or adjusted under 35 U.S.C. 154(b) by 403 days.

(21) Appl. No.: 18/286,144

(22) PCT Filed: Apr. 14, 2022

(86) PCT No.: PCT/FI2022/050252
§ 371 (c)(1),
(2) Date: Oct. 9, 2023

(87) PCT Pub. No.: WO2022/219248
PCT Pub. Date: Oct. 20, 2022

(65) Prior Publication Data

US 2024/0192676 A1 Jun. 13, 2024

(30) Foreign Application Priority Data

Apr. 16, 2021 (FI) ..................................... 20215456

(51) Int. Cl.
*G05B 23/02* (2006.01)
*G05B 13/02* (2006.01)
(Continued)

(52) U.S. Cl.
CPC ..... *G05B 23/0281* (2013.01); *G05B 23/0221* (2013.01); *G05B 13/0265* (2013.01);
(Continued)

(58) Field of Classification Search
CPC ............ G05B 23/0281; G05B 23/0221; G05B 13/0265; G06N 5/045; G06N 20/00; G06N 5/04; G06F 30/27; G06F 17/18
See application file for complete search history.

(56) References Cited

U.S. PATENT DOCUMENTS

2018/0327292 A1 11/2018 Li et al.
2020/0231466 A1 7/2020 Lu et al.
(Continued)

FOREIGN PATENT DOCUMENTS

EP 3633467 A1 4/2020

OTHER PUBLICATIONS

Lundberg et al. ("A Unified Approach to Interpreting Model Predictions". In Proceedings of the 31st Conference on Neural Information Processing Systems, Long Beach, CA, USA, Dec. 4-9, 2017; pp. 4768-4777) (Year: 2017).*
(Continued)

*Primary Examiner* — Christian T Bryant
(74) *Attorney, Agent, or Firm* — Meunier Carlin & Curfman LLC

(57) ABSTRACT

The invention provides a method for estimating disturbances and giving recommendations for process performance of a water intensive industrial process. The method takes into account a huge number of process variables.

14 Claims, 6 Drawing Sheets

Figure 1:
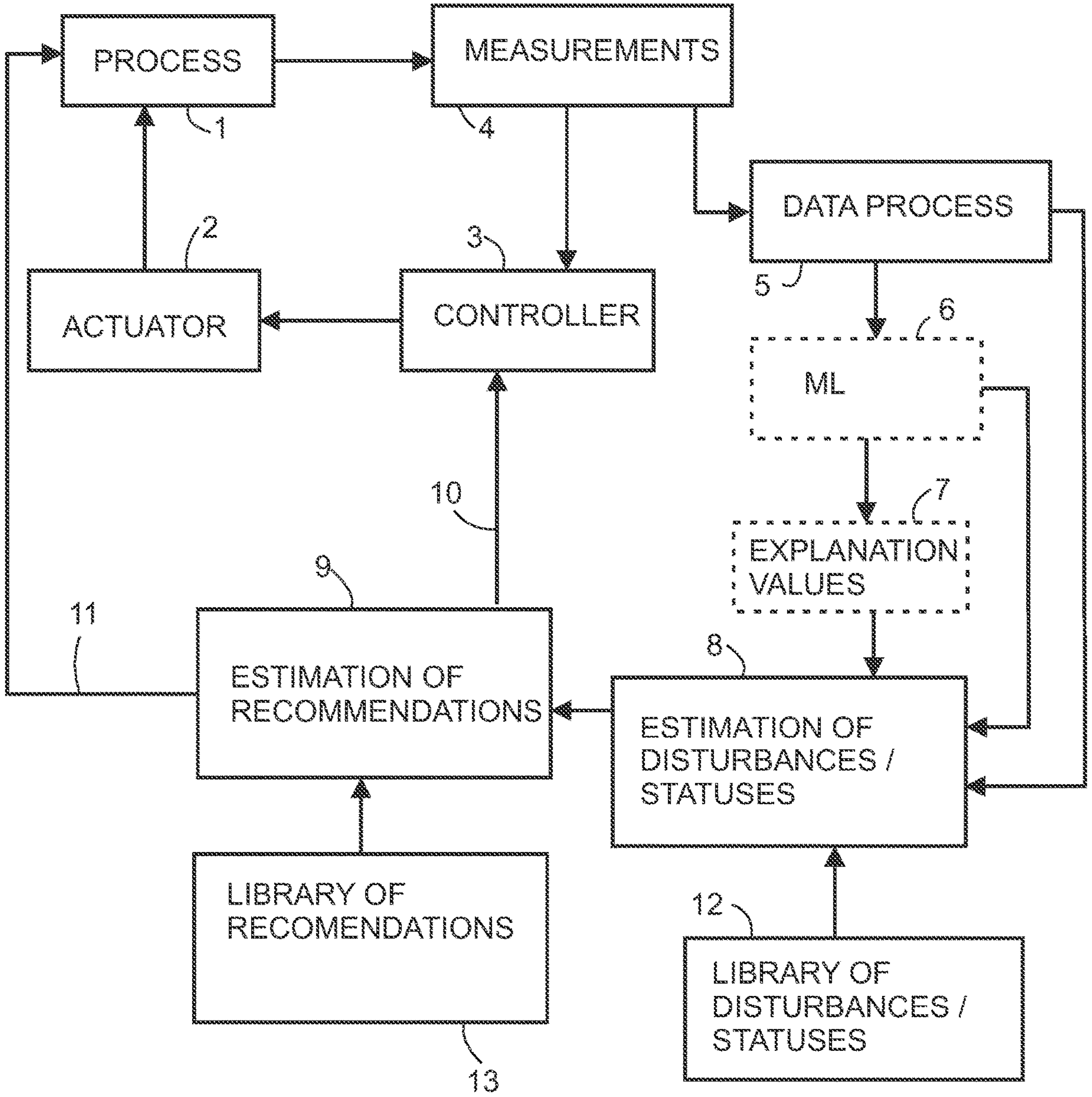

(51) Int. Cl.

| | |
|---|---|
| ***G06F 17/18*** | (2006.01) |
| ***G06F 30/27*** | (2020.01) |
| ***G06N 5/04*** | (2023.01) |
| ***G06N 5/045*** | (2023.01) |
| ***G06N 20/00*** | (2019.01) |

(52) U.S. Cl.

CPC .............. *G06F 17/18* (2013.01); *G06F 30/27* (2020.01); *G06N 5/04* (2013.01); *G06N 5/045* (2013.01); *G06N 20/00* (2019.01)

(56) References Cited

U.S. PATENT DOCUMENTS

| | | | |
|---|---|---|---|
| 2020/0387818 | A1 | 12/2020 | Chan et al. |
| 2021/0080914 | A1 | 3/2021 | Gaffor et al. |

OTHER PUBLICATIONS

International Search Report and Written Opinion in Application No. PCT/FI2022/050252, mailed Aug. 19, 2022, 16 pages.

Search Report in Finnish Application 20215456, dated Nov. 16, 2021, 2 pages.

Chakraborty, T. et al: “A hybrid regression model for water quality prediction”, Opsearch, Operational Research Society of India, IN, vol. 56, No. 4, Jun. 6, 2019 (Jun. 6, 2019) , pp. 1167-1178.

* cited by examiner

| STATUS A | STATUS B | STATUS C | STATUS D | RULE | Recommendation |
|---|---|---|---|---|---|
| OK | OK | OK | OK | IF A, B, D, D OK THEN 0,5 kg/t | 0,5 kg/t |
| OK | OK | OK | Warning Alerting | IF D Warging/alerting AND A, B, C OK, THEN 0,75 kg/t | 0,75 kg/t |
| OK or Warning | OK or Warning | OK or Warning | OK, Warning or Alerting | IF D OK, Warning OR Alerting AND at least of A, B, D is Warning, THEN 1,0 kg/t | 1,0 kg/t |
| OK, Warning or Alerting | OK, Warning or Alerting | OK, Warning or Alerting | OK, Warning or Alerting | IF D OK, Warning OR Alerting AND at least one of A, B, C is Alerting THEN 1,25 kg/t | 1,25 kg/t |

40

FIG. 4

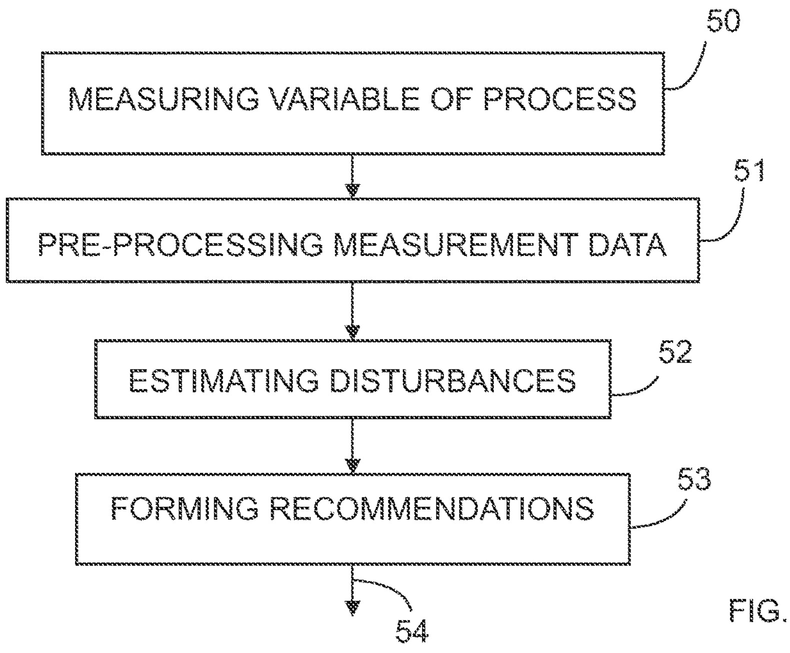

FIG. 5

| STATUS I | STATUS J | RULE | Recom menda-tion |
|---|---|---|---|
| OK | OK | IF I, J OK THEN 1 mg/l | 1 mg/l |
| Warning or Alerting | OK | IF I Warging/alerting AND J OK THEN 2 mg/l | 2 mg/l |
| OK, Warning or Alerting | Alerting | IF J Alerting, THEN 2,5 mg/l | 2,5 mg/l |
| OK, Warning or or Alerting | Warning | IF J Warning THEN 3 mg/l | 3 mg/l |

100

FIG. 10

METHOD FOR ESTIMATING DISTURBANCES AND GIVING RECOMMENDATIONS FOR IMPROVING PROCESS PERFORMANCE

CROSS REFERENCES

This application is a U.S. national stage application of international patent application number PCT/FI2022/050252 filed on Apr. 14, 2022 and claiming priority to Finnish national application number FI20215456 filed on Apr. 16, 2021.

FIELD OF TECHNOLOGY

The invention relates to a method and arrangement for estimating disturbances. The invention relates also to a method and arrangement for giving recommendations for improving process performance. The process is water intensive industrial process, for example, a papermaking process, a board machine, a waste water treatment etc.

PRIOR ART

Many industrial processes like a paper/board machine, water treatment process etc. are complicated entities. They contain many sub processes which together form a whole entity, like a paper machine. The sub processes are controlled by process specific controllers. On the other hand, the variables may affect to each other in several individual control arrangements. Therefore, different systems have been created in order to better understand the whole process.

Machine learning (ML) algorithms are used with systems, which model, analyze and estimate behavior of a process like a paper making or a water treatment. The ML algorithms are used with processes having multivariable processes, so a great number of measurements are taken. Huge amounts of data are generated and processed especially when measurements are taken online and every day.

Machine learning provides systems with an ability to automatically learn and also to improve from experience without being explicitly programmed. Thus, machine learning (ML) utilities algorithms and statistical models that computer systems use to perform a specific task or tasks without using explicit instructions. There exist several ML algorithms. Here only some of them are mentioned: linear regression, logistic regression, K-means, feed-forward neural networks etc.

The outcomes of the ML algorithms are usually difficult to interpret, especially from complex processes. Therefore, explanation values are used to help user to interpret the outcomes of the ML. Thus, explanations values are used for explaining and also for classifying how the ML works. The explanation values are obtained by using, for example, SHAP (Shapley additive explanations) values, LIME method or DeepLIFT method.

Although the monitoring systems utilize measurements and ML values, the monitoring could utilize other data as well, and in an automatic way. The monitored info can be used for recommendations to adjust certain sub-process/sub-processes.

Short Description

The object of the invention is to provide a new way to estimate disturbances and give recommendations. The object is achieved by means of independent claims. The dependent claims illustrate different embodiments of the invention.

An inventive method for estimating disturbances and giving recommendations for improving process performance has steps for measurement variables of a process and collecting process data 50, and pre-processing measurement data and collected data of the measuring and collecting step 51. The method further comprises steps for estimating disturbances 52, and forming recommendations 53.

For each disturbance estimation of a parameter of the process, the step of estimating 52 the disturbances comprise the sub steps of receiving, normalizing, operating and scaling. The receiving step 60 is for receiving the pre-processed measuring and process data from a pre-selected group of the variables of the process. The normalization step 61 is for normalizing the received pre-processed measuring and collected data. The operation step 62 is for operating the normalized data. The scaling step 63 is for scaling the operated normalized data. An output 64 of the scaling step is the disturbance estimation of the parameter of the process.

For each recommendation forming the step of forming 53 the recommendations comprise sub steps of receiving, mapping and forming. The receiving step 70 is for receiving the disturbance estimations from a pre-selected group of the outputs of the scaling step. The mapping step 71 is for mapping each received disturbance estimation to one of status categories. The forming step 72 is for forming each recommendation utilizing the mapped disturbance estimations.

An inventive arrangement estimates disturbances and gives recommendations for process performance. The arrangement has measurement devices and collecting interfaces 4 to measure variables of a process and to collect/receive process data. The arrangement also has a measurement and collected data pre-processing arrangement 5 to pre-process the measurement data and the collected data from the measuring devices and collecting interfaces.

The arrangement further comprises a first unit 8 to estimate disturbances, and a second unit 9 to form recommendations. The first unit 8 estimates the disturbances for each disturbance estimation of a parameter of the process, and it is arranged to receive the pre-processed measuring/collected data from a pre-selected group of the variables of the process, normalize the received pre-processed measuring data, operate the normalized data, and scale the operated normalized data. An output of the scaling is the disturbance estimation of the parameter of the process.

The second unit 9, for each recommendation forming, is arranged to receive the disturbance estimations from a pre-selected group of the outputs of the first unit, map each received disturbance estimation to one of status categories, and form each recommendation utilizing the mapped disturbance estimations. The same status value can be mapped to form more than one recommendation.

LIST OF FIGURES

Figure 2:
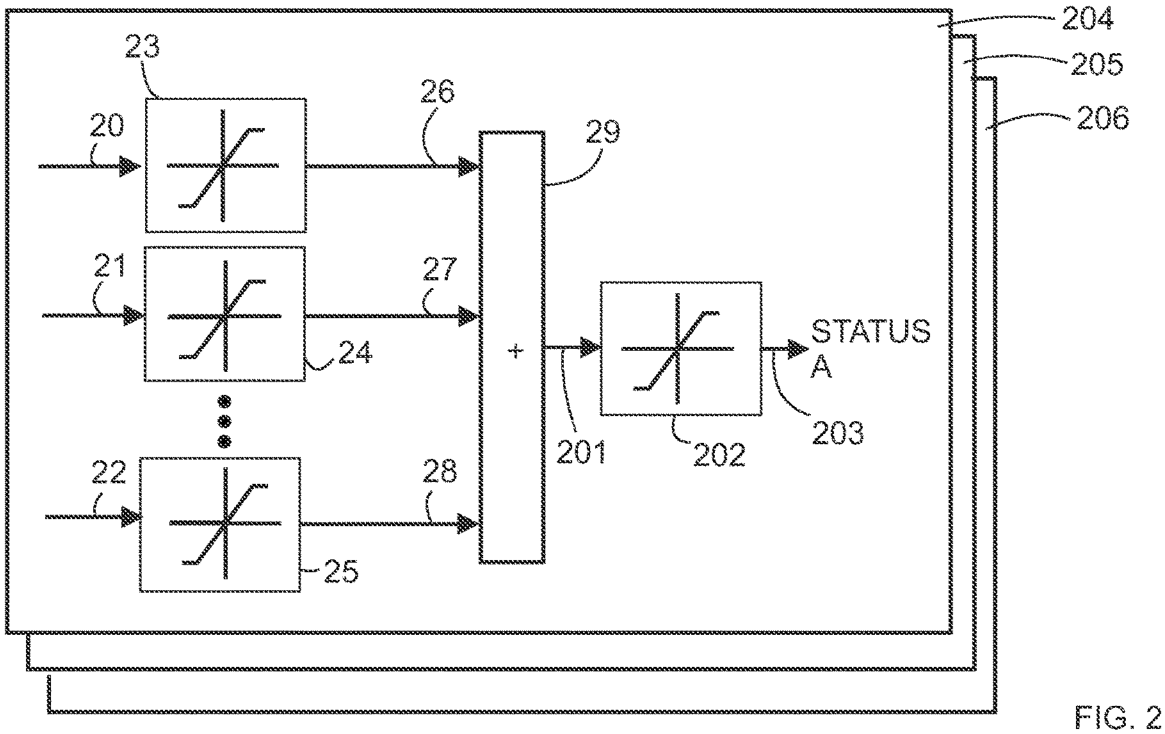
Figure 3:
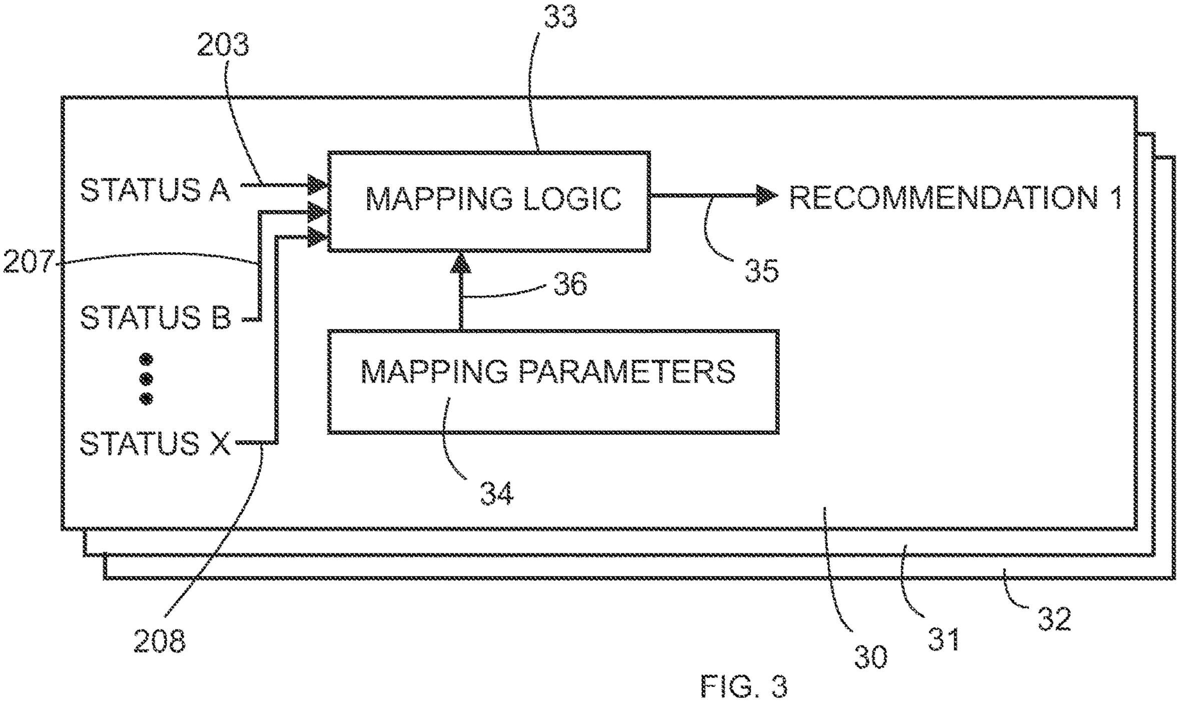
Figure 6:
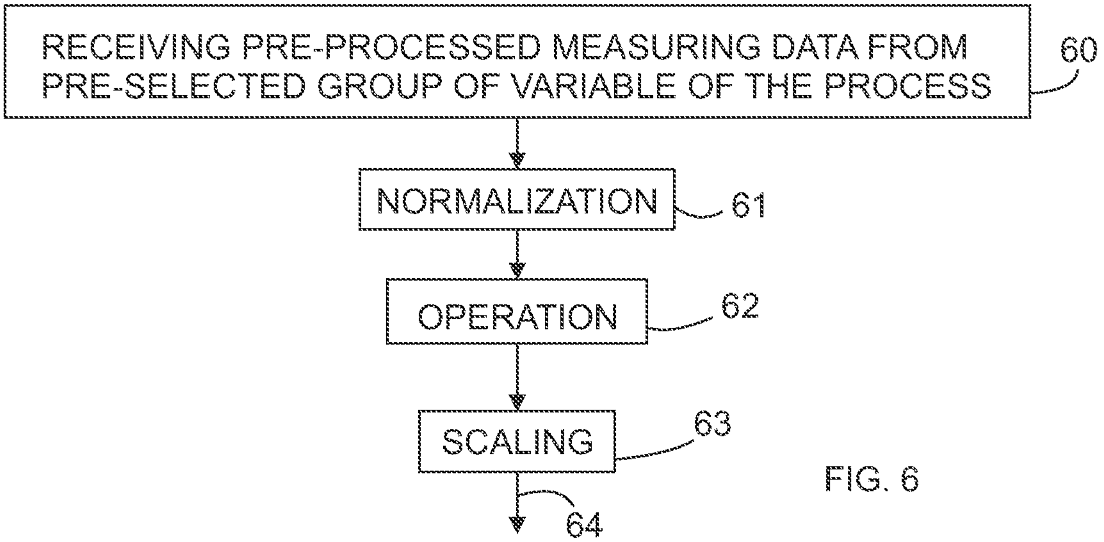
Figure 7:
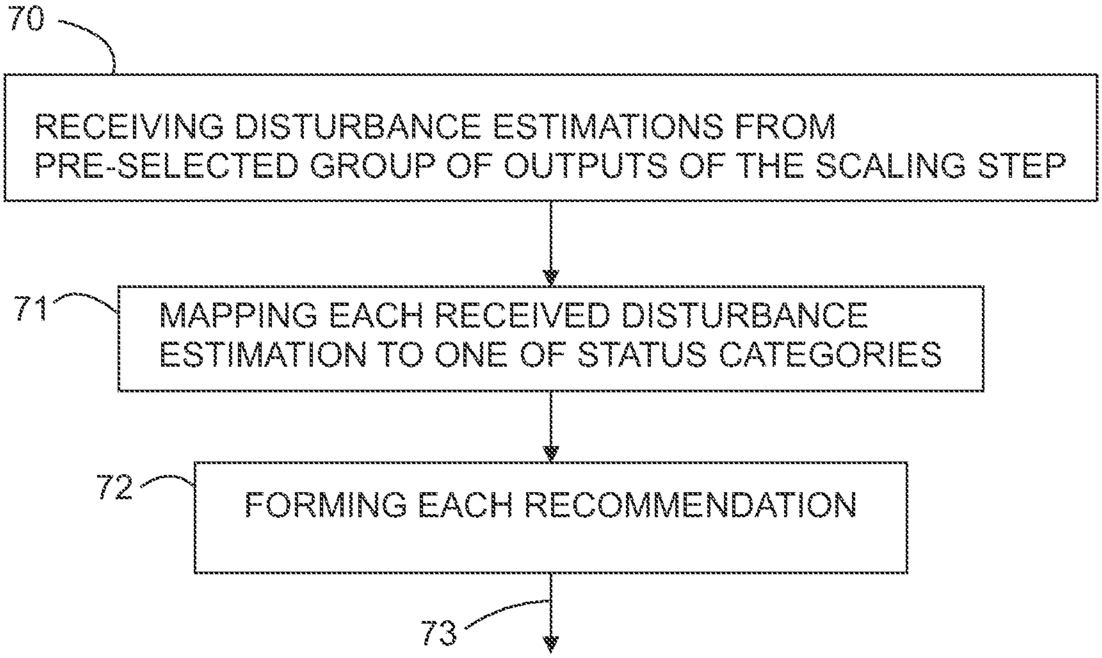
Figure 8:
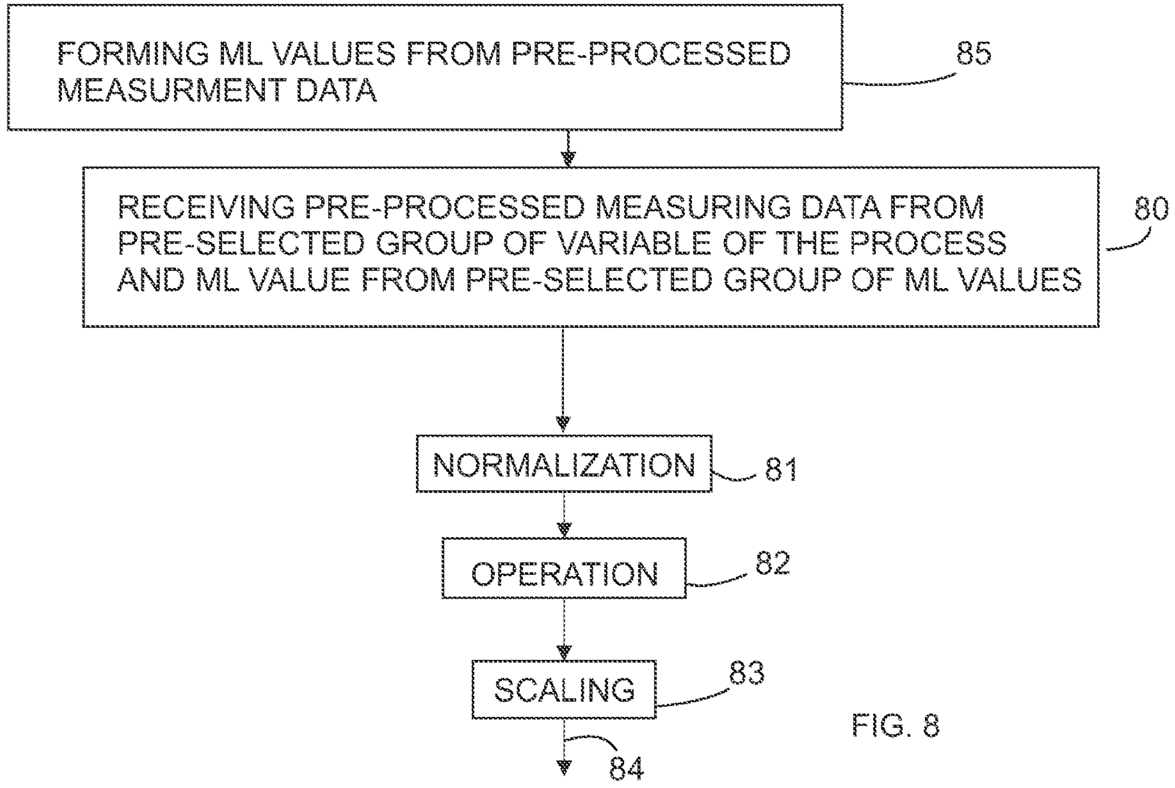
Figure 9:
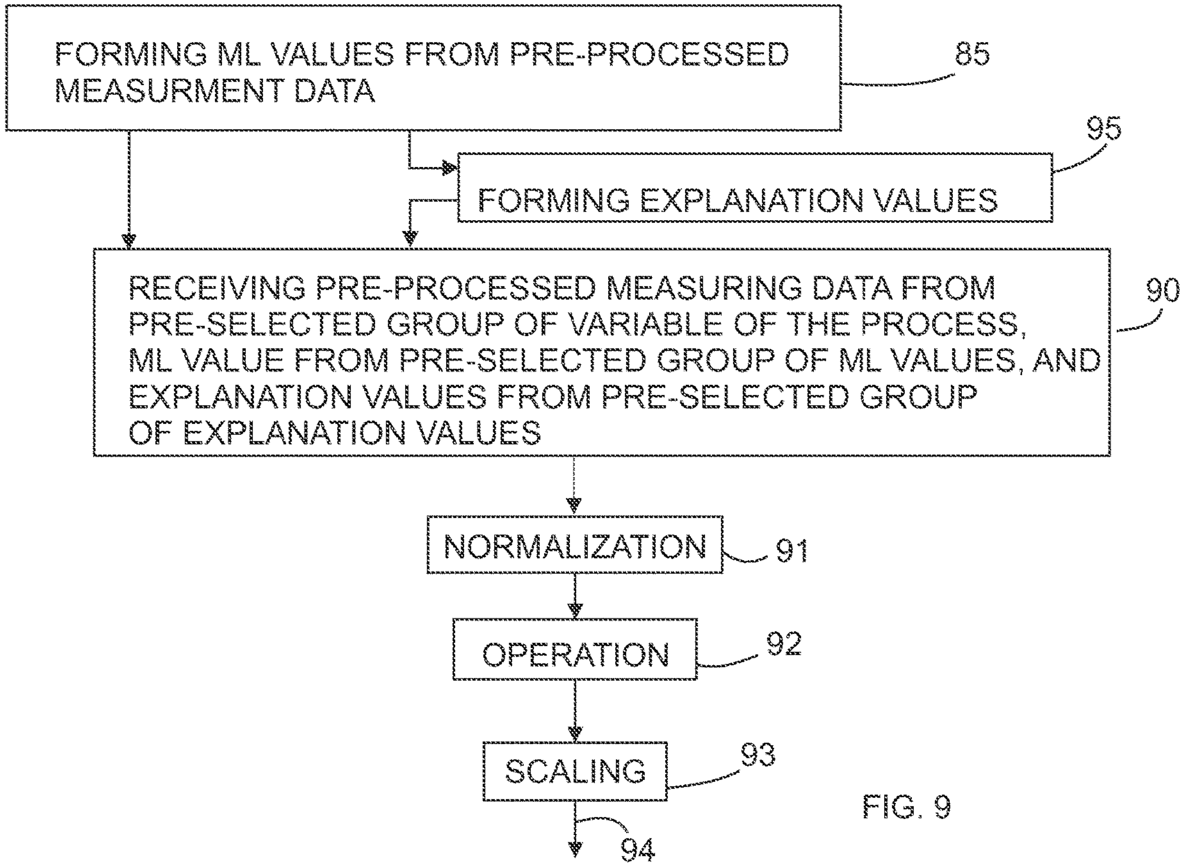

In the following, the invention is described in more detail by reference to the enclosed drawings, where FIG. 1 illustrates an example of the inventive arrangement, FIG. 2 illustrates an example of an estimation unit of the inventive arrangement, FIG. 3 illustrates an example of a recommendation unit of the inventive arrangement, FIG. 4 illustrates an example of a mapping logic to be used in the inventive arrangement, FIG. 5 illustrates an example of the inventive method, FIG. 6 illustrates an example of the estimation step of the inventive method, FIG. 7 illustrates an example of the step of forming recommendations in the inventive method, FIG. 8 illustrates a modification example of the inventive method, FIG. 9 illustrates another modification example of the inventive method, and FIG. 10 illustrates another example of a mapping logic to be used in the inventive arrangement.

DESCRIPTION OF THE INVENTION

FIG. 1 shows an example of the inventive arrangement. An inventive arrangement estimates disturbances and gives recommendations for process performance. The recommendations for the process performance comprise, for example changing the setpoints of controllers in order to improve or maintain e.g. a product quality or process stream quality, to decrease the variation in a product quality or process stream quality, keeping/maintaining the setpoints at their current values in case there is no mandatory reason to change the setpoint/s, making changes to raw materials/raw material flows for improving quality of the end product or to decrease costs etc. Thus, the process performance relates to many items, such as to keep the process in a good running state, to improve machine or process efficiency, to improve operational performance of the process, e.g. paper/board machine or other process, to prevent or decrease process breaks or shutdowns in production, improve runnability, improve the quality of the product that is produced, decrease the process costs, increasing green values by using less material or using environmentally friendly materials etc. The process 1 can, for example, be a paper/board making process, water treatment process etc.

The arrangement has measurement devices and data collecting interfaces 4 to measure variables of a process and to collect data, and a pre-processing arrangement 5 to pre-process measurement/collected data from the measuring devices and the collecting interfaces. The collecting/receiving interfaces are for example data line connections (wire connections or wireless connections) to a central managing unit or managing units of the process having configuration data of the process. Therefore, the collected data comprises the configuration data of the process (like a final surface layer of the paper to be produced, a grade of the paper to be produced) and other possible process data.

The measurements can be directly used by a controller 3 (or controllers), which drives an actuator/s 4 in order to control a sub-process or sub-processes of the whole process. The measurement devices and collecting interfaces 4, the controllers 3 and the actuators 2 are local devices within the process. The data pre-processing arrangement 5 can be local or a cloud service. It is used to: clean unreliable values from the measurements, merge data and calculate statistical values, calculating new variables based on measurements and/or variables of process data by using mathematical formulas/equations and so on. The calculated new variable may, for example, relate to amounts of raw materials, chemical efficiency, cost efficiency etc. The unreliable values are caused by sensor faults, noise etc.

The arrangement further comprises a first unit 8 to estimate disturbances, and a second unit 9 to form recommendations. The first unit 8 estimates the disturbances for each disturbance estimation of a parameter of the process, and it is arranged to receive the pre-processed measuring and process data from a pre-selected group of the variables of the process, normalize the received pre-processed measuring/process data, operate the normalized data, and scale the operated normalized data. An output of the scaling is the disturbance estimation of the parameter of the process. FIG. 2 shows the first unit 8 i.e. the estimation unit in a more detailed manner. The first unit may contain or having a connection to a library of disturbances 12, which is used when forming the estimations. The disturbance can be seen as a deviation from a desired value. However, the output of the scaling may also indicate a situation wherein there is no disturbance, which is also a disturbance estimation. Therefore, the disturbance estimation must be understood broadly in this context.

The second unit 9, for each recommendation forming, is arranged to receive the disturbance estimations from a pre-selected group of the outputs of the first unit, map each received disturbance estimation to one of status categories and form each recommendation utilizing the mapped disturbance estimations. FIG. 3 shows the second unit 9, i.e. the recommendation unit, in a more detailed manner. The recommendation/s can be used for adjusting 10 a setpoint/s of the controller/s 3, propose upstream process steps to be adjusted (e.g. raw material handling and processing) and for changing 11 raw materials of the process. The second unit 9 may contain or having a connection to a library of recommendations 13, which is used when forming the recommendations.

The inventive arrangement may also comprise a third unit 6 to form machine learning values from the pre-processed measurement and process (collected) data. The machine learning values are outcomes of the ML algorithms. The ML algorithms and their learning are known as such. Further, the inventive arrangement may also comprise a fourth unit 7 to form explanation values from the machine learning values of the third unit. These units are discussed more below.

As said, the first unit 8 estimates the disturbances for each disturbance estimation of a parameter of the process. For example, in case of a board machine a parameter can be the level of a particle retention in the wet end, from which the disturbance estimation is made. Other parameter of the board machine can be a detrimental contaminant level in a process stream, the level of particle agglomeration in another process stream, energy balances, accumulated errors, material costs, etc. The parameter may also be a calculated parameter (calculated in the pre-processing unit 5). As can be noted, the parameters relate to the process in question. In FIG. 2 estimations 204, 205, 206 are made for each parameter to be estimated. The estimation forming 204 for a certain parameter, like said particle retention in the wet end, is illustrated in more detail.

The first unit 8 is arranged to receive the pre-processed process and measuring data 20, 21, 22 from a pre-selected group of the variables of the process. The group of the variables relates to the parameter whose disturbance content is estimated. Knowledge from the process have been utilized when the pre-selection was made. Therefore, the group of the variables is usually different for each disturbance estimation.

The received pre-processed process and measuring data is normalized 23, 24, 25 individually for each variable specific process and measuring data 20, 21, 22. The normalization converts the input min-max range into another range, like 0 to 1, −1 to 1, or −2 to 2 etc, which is more convenient to use and to overcome skewness in data distribution among different variable specific measuring data. The normalization functions are specific for each received data or value.

The normalized data 26, 27, 28 is operated 29 by using an operator, like a sum, median, average, or min/max operation. The operation function may have one or more operators in order to form an output 201, i.e., an operated normalized data. The output 201 of the operation function is scaled 202 to a more suitable range in order to have an estimation which is convenient to use and easier to understand by users for possible examinations of the estimations. The scaled range, which forms the output of the scaling can, for example, be −100 to 100 or 0 to 100 etc. The output 203 of the scaling is the specific disturbance estimation of the specific parameter of the process. So, each disturbance estimation is parameter specific. The outputs, like 203, are named as status A, status B . . . status X in this description. The scaling is individual for each disturbance estimation.

As said above the disturbance estimation comprises a desired value (indicating a situation wherein there is no disturbance) and values deviating from the desired value. A disturbance relates to some parameter of the process, obtained from the measurements, process data, calculated parameters. Further, the disturbance estimation can for example be a cost function (reducing/elimination of an error), for example to energy balance, production volume, raw material cost, etc. In other words, the said operator can also be a function.

A disturbance and its estimation can describe a specific process related disturbance (chemical, mechanical, physical, microbiological) that has an impact on process performance or final product quality. It can also be said that a disturbance estimation can be an indicator which indicates the status of a certain part of process or chemistry. In other words, a disturbance can be an indicator which indicates the status of a chemical, chemistry, microbiological, mechanical or physical status of whole process or subprocess or a certain part of a process or sub process or a process stream. A disturbance estimation can be said to be a calculated performance index.

Examples of disturbances are COD load of fresh/raw water, COD load of waste water stream(s), the use or quality of a process stream, surface level of a storage tower/tank/silo, delay time in a tower or in a specific process part (too low or high), anionic trash/contaminants in a process stream, temperature (too low or high), hydrophobic contaminants, chemical inefficiency, detrimental compounds e.g. white pitch, wood pitch, extractives.

As a further example a disturbance can be hydrophobic contaminants in the wet end of a paper or board machine: high amount of hydrophobic contaminants in the wet end can cause deposits and further runnability problems like breaks in the production and low quality of end product (like defects, e.g. different kinds of spots and holes in the paper or board).

As a further example a disturbance can be chemical residual(s) or change in redox potential or pH in a process stream or in process stream in a storage tower/tank. This kind of disturbances may cause changes in the microbiological conditions in a process, such as bacterial endospore formation. Bacterial endospores in the process may e.g. cause low quality of end product (such as too high endospore content, e.g. in food packaging board). This may especially be case e.g. in when the process steam is an aqueous stream comprises natural fibers, such as fibrous suspensions or pulp suspensions.

So, the predefined variables for each predefined disturbance are the set of measurement(s), calculated measurement(s) or collected/received process data that correlates to the predefined disturbance or describe the predefined disturbance.

For example, a predefined process disturbance can be too high amount of wood extractives (=hydrophobic contaminants) in pulp A in pulping making process. Following measurements and a calculated variable are used for the calculation of the status of this disturbance: the used raw material, calculated washing efficiency of pulp A and pH of pulp A. The washing efficiency, pH and the raw material (e.g. softwood, hardwood) correlate to the amount of wood extractives in pulp A. The correlation can be found by traditional correlation analysis (using historical data, e.g. 6-12 months time period).

The grouping of input variables/parameters (measurements, process data, ML prediction, performance value, etc.) depends on the individual parameter's correlation with a specific disturbance.

FIG. 3 shows the second unit 9 in more detail. For each recommendation forming 30, 31, 32 the second unit is arranged to receive 203, 207, 208 the disturbance estimations from a pre-selected group of the outputs of the first unit 8. The pre-selection of the groups for each recommendation forming 30, 31, 32 have been made then by teaching (pre-teaching like iteration) the inventive arrangement. The pre-selection is individual for each recommendation. Knowledge from the process have been utilized when the pre-selection was made. Therefore, the group of the statuses/disturbance estimations is usually different for each recommendation.

The mapping function 33 maps each received disturbance estimation to one of status categories, and forms a recommendation 35 utilizing the mapped disturbance estimations. Threshold values can be used when mapping the disturbance estimations i.e. status A, status B, . . . status X into the status categories. For example, if the disturbance estimation range/status range is 0 to 100, an OK status category can be when the disturbance estimation is <50, and a warning status category can be for the estimations between 50-70, and an alerting status category for the estimations of >70. The threshold values relate to each individual recommendation. Categories can be also numeric values that describes the severity of the disturbance, in other words indicating how huge effect the disturbance has on process performance or product quality or any other target.

The forming of the recommendation can use a mapping logic having rules for different recommendations. The recommendation may relate to a dosing amount, like keeping the current dosing, decreasing the dosing, or increasing the dosing. The mapping function 33 may contain mapping parameters (thresholds and dosing parameters) or it is connected 36 to a library 34 of the mapping parameters. FIG. 4 shows an example of the mapping logic in a table form. The table form is used here because it is easy to illustrate, so the logic can be in any suitable form. However, it is worth to note other embodiments can also be used, for example fuzzy logic in order to connect a certain group of the disturbance estimations to the recommendations to be given. The example of FIG. 4 is generic, but it may be easier to follow if it is considered to relate to a board machine having different streams 1, 2, and 3 before the wet end and a chemical CH is dosed into the stream 3. In this board machine example Status A is detrimental contaminants in the stream 1. Status B is detrimental contaminants in the stream 2. Status C is the level of particle agglomeration in stream 3, and Status D is the level of particle retention in the wet-end. The estimations/statuses can be mapped into different categories: OK, Warning and Alerting. The different statuses and categories perform several different combinations. A single combination or a group of combinations are linked to a specific rule, which form a dosing recommendation for the chemical CH as can be seen in FIG. 4. The rules can be in the form of IF-THEN statements and they may contain operators like AND, OR etc. When providing the recommendations the logical operators are not the only choice. The mapping function 33 can contain logic for utilizing scaled parameters for providing the recommendations based on the received process status parameters. Thus, the recommendations can also be recommendation parameters, for example in the form of dosing curves used as input to a dosing control unit. Further, the rules for providing the recommendations can be also any mathematical equation/function that describes the relation between a recommendation and the status of preselected disturbances, like y=x1+x2+x3, where y is the amount of chemical, and x1, x2, x3 are statuses of preselected disturbances.

FIG. 10 shows another embodiment 100 for mapping the disturbance estimations and providing the recommendations. This example illustrates a waste water treatment process. Thresholds used for status values being in the range of −100 to 100. If the value is below 0 the disturbance estimation is at OK level. If the value is between 0 to 50 the disturbance estimation is at a warning level. If the value is above 50 the disturbance estimation is at an alerting level. The status I can represent a COD load in the outlet of a sub treatment process. The status J can represent suspended solid loads in an outlet of a solid separation. IF statuses I and J are OK THEN recommended dose is 1 mg/l. (However, if the all statuses are ok, it is fine to keep the current dosing and not to follow the recommendation.) IF the status I is warning or alerting, AND the status J is OK, THEN recommended dose is 2 mg/l. IF the status J is alerting (no matter what the status I is), THEN recommended dose is 2.5 mg/l. IF the status J is warning, THEN recommended dose is 3 mg/l. The chemical for the dosing can be a flocculant.

The arrangement may comprise the third unit 6 to form machine learning values from the pre-processed measurement and process data, which machine learning values are also used with the pre-processed measuring and process data in the first unit 8. The machine learning values are outcomes of the ML algorithms. So, the first unit is arranged to also receive the machine learning values from a pre-selected group of the machine learning values, to also normalize the received machine learning values, to also operate the normalized machine learning values, and to also scale the operated normalized machine learning values. The output of the scaling is the disturbance estimation of the parameter of the process.

In order to understand the process the machine learning (ML) values are formed. The machine learning is used for extracting information and patterns in large datasets. The matching learning algorithms are usually based on statistical models, which a computer can use to perform a certain task without having exact instructions but relies instead on recognizing patterns. The recognized patterns can be obtained by building a mathematical model based on a training dataset. Simulations and pattern recognition can be made by feeding new data to the mathematical model.

The arrangement may also comprise the fourth unit 7 to form explanation values from the machine learning values of the third unit. The explanation values are also used with the pre-processed measuring and process data and the machine learning values in the first unit. So, the first unit 8 is arranged to also receive the explanation values from a pre-selected group of the explanation values, to also normalize the received explanation values, to also operate the normalized explanation values, and to also scale the operated normalized explanation values. The output of the scaling is the disturbance estimation of the parameter of the process.

Because it is hard to see what is going on in the process from the output (predictions/simulations) of ML, the explanation values, like SHAP values, are used to track how ML predictions link back to the input variables. For each prediction a rating number is calculated for each input variable indicating how the variable is contributing to the final predictions. These rating numbers can be seen as explanation values indicating the significance of an input value at a given point in time.

The explanation values of machine learning are, for example, SHAP values, values from a LIME method, values from a DeepLIFT method or any other possible explanation values. The LIME method interprets individual model predictions, which are based on locally approximation the model around a given prediction. LIME refers to simplified inputs x as interpretable inputs. The mapping x=hx(x) converts a binary vector of interpretable inputs into the original input space. Different types of hx mappings are used for different input spaces.

DeepLIFT is a recursive prediction explanation method. It attributes to each input xi a value CΔxiΔy that represents the effect of that input being set to a reference value as opposed to its original value. It means that DeepLIFT mapping x=hx(x) converts binary values into the original inputs, where 1 indicates that an input takes its original value, and 0 indicates that it takes the reference value. The reference value represents a typical uninformative background value for the feature.

The SHAP (SHapley Additive explanation) explanation values attribute to each feature the change in the expected model prediction when conditioning on that feature. The values explain how to get from a base value an expectation E[f(z)] that is going to be predicted if we did not know any features to the current output f(x). The order how features are added in the expectations matters. However, this is taken into account in SHAP values.

FIG. 5 show a flow chart example of the inventive method. The inventive method is for estimating disturbances and giving recommendations for improving process performance. It has steps for measuring variables of a process 50, and pre-processing measurement and process data of the measuring step 51. The method further comprises steps for estimating disturbances 52, and forming recommendations 53. As said the recommendations outputs can be used as adjusting setpoint of the local control loops. The setpoint recommendations can, for example, be for dosing of chemicals, such as retention chemicals, sizing agents, deposit control chemicals, charge control chemicals, strength chemicals, defoamers, dispersing agents, biocides, coagulants, flocculants.

The estimation step 52 is illustrated in more detail in FIG. 6. For each disturbance estimation of a parameter of the process, the step of estimating 52 the disturbances comprises the sub steps of receiving, normalizing, operating and scaling. The receiving step 60 is for receiving the pre-processed process and measuring data from a pre-selected group of the variables of the process. The normalization step 61 is for normalizing the received pre-processed measuring and process data. The operation step 62 is for operating the normalized data. The scaling step 63 is for scaling the operated normalized data. An output 64 of the scaling step is the disturbance estimation of the parameter of the process. The functions of these steps were discussed above.

The recommendation forming step 53 is illustrated in more detail in FIG. 7. For each recommendation forming the step of forming 53 the recommendations comprise sub steps of receiving, mapping and forming. The receiving step 70 is for receiving the disturbance estimations from a pre-selected group of the outputs of the scaling step. The mapping step 71 is for mapping each received disturbance estimation to one of status categories. The forming step 72 is for forming each recommendation utilizing the mapped disturbance estimations. As said the recommendations outputs 73 can be used as adjusting setpoint of the local control loops or changes in raw materials.

FIG. 8 shows a modified method according to the invention. It comprises a further step 85 for forming machine learning values from the pre-processed process and measurement data. The machine learning values are also used with the pre-processed measuring and process data when estimating disturbances. So, the receiving step 80 also receives the machine learning values from a pre-selected group of the machine learning values, the normalization step 81 also normalizes the received machine learning values, the operation step 82 also operates the normalized machine learning values, and the scaling step 83 also scales the operated normalized machine learning values. The output of the scaling step is the disturbance estimation of the parameter of the process status.

FIG. 9 shows a further modified method according to the invention. It comprises a further step 95 for forming explanation values from the machine learning values, which explanation values are also used with the pre-processed measuring and process data and the machine learning values when estimating disturbances. So, the receiving step 90 also receives the explanation values from a pre-selected group of the explanation values, the normalization step 91 also normalizes the received explanation values, the operation step 92 also operates the normalized explanation values, and the scaling step 93 also scales the operated normalized explanation values. An output 94 of the scaling step is the disturbance estimation of the parameter of the process. The function of FIGS. 5-9 are discussed also above with the description of the inventive arrangements.

Further, the normalization step may comprise normalization functions, which are specific for each received data or value. The operation step may comprise one or more operations. The operation is a sum, median, average, min/max operation etc. The scaling of the scaling step is individual for each disturbance estimation. The formed recommendations are used for adjusting setpoints of different control arrangements of the process and/or for changing raw material of the process, to adjust one or more upstream process steps (e.g. raw material handling and processing). The recommendations can also be overall targets for energy balance, production volume, raw material cost, etc. in order to minimize disturbances, minimize cost, minimize energy, enhance production targets, stabilize operational processes, etc. Changing raw material in a process may be e.g. changing a contaminated raw material from to a less or non-contaminated raw material. An example is a fibrous suspension (e.g. pulp suspension) which is microbiologically contaminated to an unacceptable level.

The formed recommendations can be used for adjusting setpoints of chemical dosing (e.g. retention chemicals, sizing agents, deposit control chemicals, charge control chemicals, strength chemicals, defoamers, dispersing agents, biocides, coagulants, flocculants). Further, the recommendations can be used for adjusting setpoints for tower levels/tower filling/emptying, for adjusting the amount of dilution water to pulp washers, for improving washing efficiency of pulp(s), for adjusting pH value of a process stream(s), mentioning some examples.

The formed recommendations can be used for adjusting setpoints for dosing of chemicals, such as retention chemicals, sizing agents, deposit control chemicals, charge control chemicals, strength chemicals, defoamers, dispersing agents, biocides, coagulants, flocculants; for tower levels/tower filling/emptying, for adjusting the amount of dilution water to pulp washers, for improving washing efficiency of pulp(s), for adjusting pH value of a process stream(s), for delay times in storage towers, surface level(s) in storage towers, or aeration, circulation or mixing of a process stream in in storage towers, e.g storage towers of fibrous suspensions.

The invention provides a generic method and arrangement for estimating disturbances and giving recommendations for a water intensive industrial process having several subprocesses and a large number of variables, which affect to each other. The arrangement and method are taught before it is used. Expert knowledge and process knowledge can be used during the teaching phase. E.g. expert knowledge or process knowledge obtained by correlation analysis or iteration. The above said pre-selections and determinations of the threshold values, normalization selections, operator selections, scaling selections etc. are made also during the teaching phase. One possible way is the correlation analysis based on historical data. The idea is to find out the process disturbances that causes problems in process performance (e.g. breaks in papermaking production, insufficient solid-liquid separation in waters to be treated) and/or weakens the product quality (e.g. weak strength, the number of defects increases). Domain and application experts have also a lot of tacit information, which can be collected by interviewing. The needed information can be also collected by doing tests in the lab or real process (e.g. by changing chemical dosages (the amount, dosing points, type). The teaching comprises also iteration steps.

When teaching the process disturbances, which have an effect to a certain target, are identified and selected. The target is, for example, maintaining a good process condition, improve product quality, etc. The identifying and selection of disturbances can be done by domain and application experts, visual inspection of data, calculations (like correlation calculations), ML performance values and other statistical calculations. A group of the variable of the process is selected (pre-selection) for each disturbance.

The grouping of the variables (measurements process data, ML prediction, performance value, etc.) depends on the individual variable's correlation with a specific disturbance. Thus the group of variables for each predefined disturbances are the set of measurement(s) or calculated measurement(s)/variables(s) that correlates to the predefined disturbance or describe the predefined disturbance. As said the selection of variables for each disturbance can be based on expert knowledge, process knowledge and/or analysis of historical data (e.g. correlation analysis, statistical analysis).

Regarding the normalization (61) and operation (62) steps, the parameters for normalization can be for example minimum and maximum values of variables or 25% and 75% quartiles from historical data (e.g. minimum value corresponds to 0 and maximum value correspond to 1). The selection of mathematical operator for operation step 62 is based on the causal dependences/relationship of a disturbance and preselected variables (based on process expert(s) knowledge and/or analysis of historical data).

Regarding scaling step 63, the parameters of scaling function is based on the causal dependences/relationship of a disturbance and preselected variables (based on process expert(s) knowledge and/or analysis of historical data).

When providing pre-selected groups of the outputs of the scaling steps, correlation information is used. Thus, for each recommendation a pre-selected set of inputs are identified based on their correlation with the recommendation. The correlation information may contain correlation calculations, ML performance values and other statistical calculations. The knowledge for providing recommendations is based on historical data/information on process performance.

The method and the arrangement can be mainly provided as a cloud service and on line, but it can also be a local method and arrangement within the process. So, said units can be provided in a server/servers in the could or locally. In more detail, the units can be realized as circuit boards, software or their combination, or computers. It also clear that the said library/libraries is a database/memory. As described above, the invention provides a new method and arrangement to estimate disturbances and give recommendations. The idea is to use said pre-selected groups of variables (inputs) and pre-selected groups of disturbance estimates in several phases.

By using combination (group) of the selected disturbances, a recommendation that optimizes the effect of each disturbance in the group, can be provided.

Partly because of the groupings, the method and arrangement according to the invention is providing more reliable recommendations. Using the method and arrangement according to the invention, the process becomes more stable, i.e. it is possible to mitigate efficiently the disturbances before they cause larger disturbances to the process.

The pre-selection of the variables of a process/process data to a group may be done by expert knowledge or process knowledge, e.g. by finding variables that correlate with a certain process variable. The pre-selection the group of the disturbance estimations of the parameters of the process may be done so that they form input to a recommendation. In other words, what group of disturbance estimations can be affected with a recommendation.

Further, using combination of recommendations can be used to further stabilize the overall process by mitigating combined set of disturbances.

This is especially the case when the water intensive process has several hundreds or even more than one thousand inputs into the arrangement for estimating disturbances and for giving recommendations. This kind of processes are a pulp making process, papermaking process, tissue making process, board making process, and waste water treatment process and raw water treatment process. This kind of processes are specifically a pulp making process, papermaking process, board making process, and waste water treatment process.

When using prior art methods or arrangements, the obtained recommendations would be less accurate or unreliable.

Further, it is worth to mention that the inputs for said method and arrangement according to the invention can be measurement/process data, ML values, and/or explanation values.

The process is a water intensive industrial process, such as a pulp making process, papermaking process, board making process, tissue making process, paper machine, pulp mill, tissue machine, board machine, water treatment process, waste water treatment process, raw water treatment process, water re-use process, any industrial water treatment process, municipal water, municipal waste water treatment process, sludge treatment process, mining process, oil recovery process or any other water intensive industrial process. The process may be e.g. a pulp making process, papermaking process, tissue making process, board making process, and waste water treatment process and raw water treatment process. Examples of processes are also a pulp making process, papermaking process, board making process, and waste water treatment process.

It is evident from the above that the invention is not limited to the embodiments described in this text but can be implemented utilizing many other different embodiments within the scope of the independent claims.

The invention claimed is:

1. A method for estimating disturbances and giving recommendations for process performance of a water intensive industrial process having steps for measuring variables of the process and collecting process data, and pre-processing measurement and process data of the measuring and collecting step wherein the method comprises steps for estimating disturbances, and forming recommendations, for each disturbance estimation of a parameter of the process the step of estimating the disturbances comprising the sub steps for receiving the pre-processed measurement and process data from a pre-selected group of the variables of the process, machine learning prediction values, the machine learning prediction values being outputs of a trained machine learning model formed from the pre-processed measurement and process data, and explanation values formed from the machine learning prediction values and quantifying, for each machine learning prediction value, a contribution of each input variable to that prediction, from respective pre-selected groups of machine learning prediction values and explanation values, normalizing the received pre-processed measurement and process data, the received machine learning prediction values, and the received explanation values, operating the normalized data comprising the normalized pre-processed measurement and process data, the normalized machine learning prediction values, and the normalized explanation values, and scaling the operated normalized data, an output of the scaling step being the disturbance estimation of the parameter of the process, for each recommendation forming the step of forming the recommendations comprises sub steps for receiving the disturbance estimations from a pre-selected group of the outputs of the scaling step, mapping each received disturbance estimation to one of status categories, and forming each recommendation utilizing the mapped disturbance estimations, and applying the formed recommendations as setpoints to controllers of the water intensive industrial process to adjust at least one of: chemical dosing, tower levels or tower filling/emptying, an amount of dilution water to pulp washers, washing efficiency of pulp, pH value of a process stream, delay times in storage towers, surface levels in storage towers, or aeration, circulation or mixing of a process stream in storage towers.

2. The method according to claim 1, wherein the normalization step comprises normalization functions, which are specific for each received data or value.

3. The method according to claim 1, wherein the operation step comprises one or more operations.

4. The method according to claim 1, wherein the operation is a sum, median, average, or min/max operation.

5. The method according to claim 1, wherein the scaling of the scaling step is individual for each disturbance estimation.

6. The method according to claim 1, wherein the formed recommendations are used for adjusting setpoints of different control arrangements of the process and/or for changing raw material of the process.

7. The method according to claim 6, wherein the setpoint recommendations comprises recommendations for dosing of chemicals, retention chemicals, sizing agents, deposit control chemicals, charge control chemicals, strength chemicals, defoamers, dispersing agents, biocides, coagulants, flocculants; for tower levels/tower filling/emptying, for adjusting the amount of dilution water to pulp washers, for improving washing efficiency of pulp(s), for adjusting pH value of a process stream(s), for delay times in storage towers, surface level(s) in storage towers, or aeration, circulation or mixing of a process stream in in storage towers, storage towers of fibrous suspensions.

8. The method according to claim 1, wherein the process is a pulp making process, papermaking process, board making process, tissue making process, paper machine, pulp mill, tissue machine, board machine, water treatment process, waste water treatment process, raw water treatment process, water re-use process, any industrial water treatment process, municipal water, municipal waste water treatment process, sludge treatment process, mining process, or oil recovery process.

9. An arrangement to estimate disturbances and to give recommendations in order to improve process performance, the arrangement having measurement devices and receiving interfaces to measure variables of a process, and receive process data, and a pre-processing arrangement to pre-process measurement and process data from the measuring devices and the receiving interfaces, wherein the arrangement comprises:

a first unit to estimate disturbances, and a second unit to form recommendations, which first unit, in order to estimate the disturbances for each disturbance estimation of a parameter of the process, is arranged to receive the pre-processed process and measuring data from a pre-selected group of the variables of the process, a third unit to form machine learning prediction values, the machine learning prediction values being outputs of a trained machine learning model formed from the pre-processed measurement and process data, and the first unit is arranged to also receive the machine learning prediction values from a pre-selected group of the machine learning prediction values to estimate disturbances, a fourth unit to form explanation values formed from the machine learning prediction values from the third unit, and quantifying, for each machine learning prediction value, a contribution of each input variable to that prediction, from respective pre-selected groups of machine learning prediction values and explanation values, wherein the first unit is arranged to also receive the explanation values from a pre-selected group of the explanation values to estimate disturbances, normalize the received pre-processed measuring data, the received machine learning prediction values and the received explanation values, operate the normalized data, comprising the normalized pre-processed measurement and process data, the normalized machine learning prediction values and the normalized explanation values, and scale the operated normalized data, an output of the scaling being the disturbance estimation of the parameter of the process, wherein the second unit, for each recommendation forming, is arranged to:

receive the disturbance estimations from a pre-selected group of the outputs of the first unit, map each received disturbance estimation to one of status categories, and form each recommendation utilizing the mapped disturbance estimations, and apply the formed recommendations as setpoints to controllers of the water intensive industrial process.

10. The arrangement according to claim 9, wherein said normalization comprises normalization functions, which are specific for each received data or value.

11. The arrangement according to claim 9, wherein said operation comprises one or more operations.

12. The arrangement according to claim 9, wherein the operation is a sum, median, average, or min/max operation.

13. The arrangement according to claim 9, wherein said scaling is individual for each disturbance estimation.

14. The arrangement according to claim 9, wherein the process is a pulp making process, papermaking process, board making process, tissue making process, paper machine, pulp mill, tissue machine, board machine, water treatment process, waste water treatment process, raw water treatment process, water re-use process, any industrial water treatment process, municipal water, municipal waste water treatment process, sludge treatment process, mining process, or oil recovery process.

* * * * *